United States Patent
Huang

(10) Patent No.: US 11,502,277 B2
(45) Date of Patent: Nov. 15, 2022

(54) ORGANIC LIGHT-EMITTING DIODE DISPLAY PANEL

(71) Applicant: SEEYA OPTRONICS CO., LTD., Shanghai (CN)

(72) Inventor: Zhongshou Huang, Shanghai (CN)

(73) Assignee: SEEYA OPTRONICS CO., LTD., Shanghai (CN)

( * ) Notice: Subject to any disclaimer, the term of this patent is extended or adjusted under 35 U.S.C. 154(b) by 0 days.

(21) Appl. No.: 17/160,689

(22) Filed: Jan. 28, 2021

(65) Prior Publication Data

US 2022/0006058 A1 Jan. 6, 2022

(30) Foreign Application Priority Data

Jul. 1, 2020 (CN) .......................... 202010628374.3

(51) Int. Cl.
*H01L 51/52* (2006.01)
*H01L 27/32* (2006.01)

(52) U.S. Cl.
CPC ........ *H01L 51/5275* (2013.01); *H01L 27/326* (2013.01)

(58) Field of Classification Search
CPC combination set(s) only.
See application file for complete search history.

(56) References Cited

U.S. PATENT DOCUMENTS

| | | | |
|---|---|---|---|
| 6,542,207 B1 | 4/2003 | Yoshizawa | |
| 2006/0138440 A1* | 6/2006 | Jyo | G09F 9/33 257/E33.072 |
| 2012/0305950 A1* | 12/2012 | Shikina | H01L 51/5275 257/40 |
| 2019/0103587 A1* | 4/2019 | Lee | H01L 51/5271 |
| 2021/0057678 A1* | 2/2021 | Motoyama | H01L 27/3258 |

FOREIGN PATENT DOCUMENTS

| | | |
|---|---|---|
| CN | 102550126 | 7/2012 |
| CN | 102683607 | 9/2012 |
| CN | 103700774 | 4/2014 |

(Continued)

OTHER PUBLICATIONS

First Office Action dated Feb. 14, 2022 for Corresponding Chinese Patent Application No. 202010628374.3.

*Primary Examiner* — Suberr L Chi
(74) *Attorney, Agent, or Firm* — Duane Morris LLP

(57) ABSTRACT

An organic light-emitting diode display panel includes a substrate and a light-emitting pixel array disposed on the substrate, and the light-emitting pixel array includes a plurality of light-emitting pixels. Each of the plurality of light-emitting pixels comprises a convex structure layer, a light-emitting element, a planarization layer and a microlens structure which are sequentially stacked on the substrate. The convex structure layer comprises at least one convex structure which is convex in a direction facing away from the substrate and at least one convex surface where each of the at least one convex structure is in contact with the light-emitting element. The microlens structure and convex structure are aligned each other that their vertical projections on the substrate overlap with a vertical projection of the light-emitting element on the substrate.

13 Claims, 7 Drawing Sheets

(56) References Cited

FOREIGN PATENT DOCUMENTS

| | | |
|---|---|---|
| CN | 105826356 | 8/2016 |
| CN | 106299150 | 1/2017 |
| JP | 2002124373 | 4/2002 |
| JP | 2005174717 | 6/2005 |
| KR | 20190037603 | 4/2019 |
| TW | 576123 | 2/2004 |

* cited by examiner

—Prior Art—

ORGANIC LIGHT-EMITTING DIODE DISPLAY PANEL

CROSS-REFERENCES TO RELATED APPLICATION

This application claims to the priority of Chinese patent application No. 202010628374. 3 filed on Jul. 1, 2020, which is incorporated herein by reference in its entirety.

TECHNICAL FIELD

The present disclosure relates to the field of display technologies and, in particular, to an organic light-emitting diode display panel.

BACKGROUND

In recent years, organic light-emitting diode display (OLED hereinafter) panels have gradually become the mainstream of mobile terminal screens and display screens. An OLED panel includes a plurality of sub-pixels arranged in an array, where each sub-pixel includes a pixel driving circuit and a light-emitting element electrically connected to the pixel driving circuit.

As part of the large-angle light in the light emitted from the OLED panel cannot reach human vision system, a large power consumption problem of the OLED panel caused by light waste may occur. In order to ensure that the large-angle light emitted from the OLED panel is converged into the viewing angle of an observer, in the related art, a micro convex lens is configured above each OLED pixel, and light photons emitted from the light-emitting element in the corresponding pixel are converged into a parallel or an approximately parallel emitting light beam through the micro convex lens, thus ensuring that the output light photons are efficiently collected by the human vision system in a relative long distance without being diffused and lost midway.

However, when a convex lens is configured above an OLED pixel, light emitted from a light-emitting surface having an area about the same dimension as the area of the convex lens cannot be focused into a parallel light beam or an approximately parallel light beam through the convex lens, and still a considerable part of light is emitted at a large angle and cannot reach the human vision system, resulting in a loss of more light.

SUMMARY

Embodiments of the present disclosure provide an OLED panel to increase the weight of parallel light in the light emitted from a microlens structure, so that the display brightness of the OLED panel is increased.

An OLED panel is provided in the embodiments of the present disclosure and includes a substrate and a light-emitting pixel array located on the substrate and including a plurality of light-emitting pixels.

Each of the plurality of light-emitting pixels includes a convex structure layer, a light-emitting element, a planarization layer and a microlens structure which are sequentially stacked on the substrate.

The convex structure layer includes at least one convex structure which is convex in a direction facing away from the substrate and at least one convex surface where each of the at least one convex structure is in contact with the light-emitting element.

The microlens structure and the convex structure are aligned each other that their vertical projections on the substrate overlap with a vertical projection of the light-emitting element on the substrate.

According to the OLED panel provided in the embodiments of the present disclosure, the light-emitting pixel includes the convex structure layer, the light-emitting element, the planarization layer and the microlens structure which are sequentially stacked on the substrate, the microlens structure the convex structure are aligned each other that their vertical projections on the substrate overlap with the vertical projection of the light-emitting element on the substrate. The convex structure is disposed on one side of the light-emitting element facing towards the substrate, so that through coupling of the convex structure and the microlens structure, the parallel light component among the light emitted from the microlens structure is increased, and the display brightness of the OLED panel is increased.

DETAILED DESCRIPTION

Figure 1:
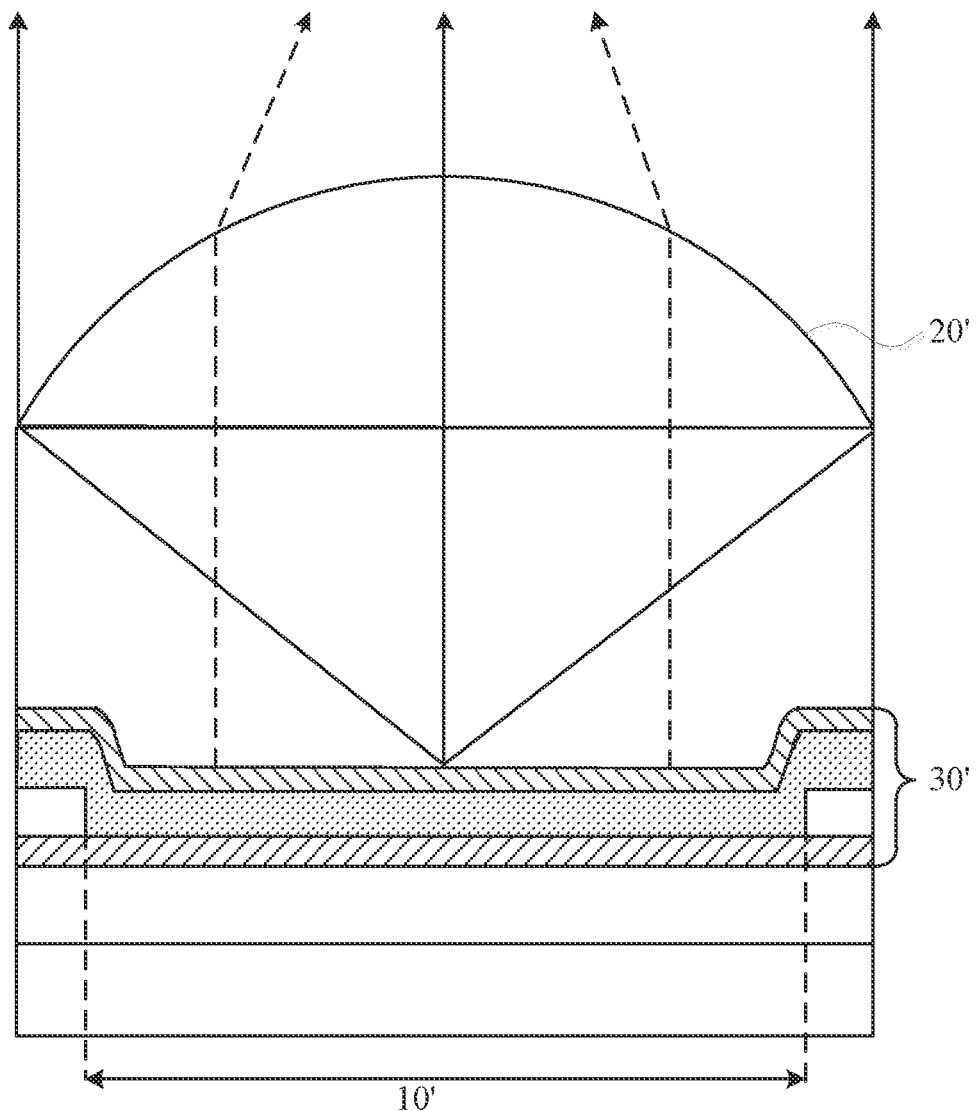
FIG. 1 shows a cross-sectional view of an OLED panel in a related art according to embodiments of the present disclosure.

Hereinafter the present disclosure is further described in detail in conjunction with the drawings and embodiments. It is to be understood that the embodiments set forth below are intended to illustrate and not to limit the present disclosure. Additionally, it is to be noted that for ease of description, only part, not all, of the structures related to the present disclosure are illustrated in the drawings.

Illustrated in FIG. 1 is a cross-sectional view of an OLED panel in the related art. As shown in FIG. 1, a microlens structure 20' is disposed above each light-emitting pixel 10', and light photons emitted from the light-emitting element 30' in the corresponding light-emitting pixel 10' converge into a parallel or a substantially parallel light beam through the microlens structure 20', thereby ensuring that the output light photons are efficiently collected by the human vision system in a relatively long distance without being diffused and lost midway. However, in fact, since the area of the light-emitting element 30' is in similar dimension as the microlens diameter and no longer a valid point source, only a part of the light photons emitted from the light-emitting element 30' can form a parallel or approximately parallel light beam through the microlens structure 20'. As shown by the solid line in FIG. 1, still a significant portion of the light photons are emitted into the space beyond a viewing angle of the observer, causing either dark display image or extra power consumption.

Aiming to solve the above-mentioned problems, an OLED panel is provided in the embodiments of the present disclosure. The OLED panel includes a substrate and an array of light-emitting pixels. The light-emitting pixel includes a convex structure layer, a light-emitting element, a planarization layer and a microlens structure which are sequentially stacked on the substrate. The convex structure layer includes one convex structure. The microlens structure and the convex structure are aligned each other that their vertical projections on the substrate overlap with the vertical projection of the light-emitting element on the substrate. Curvature of the microlens and curvature of the convex structure are conformally matching each other in such a way that all normal light traces from the light emitting surface will be diffracted and converged into a substantially collimated light beam after the microlens. By such an arrangement, the majority of light photons emitted from the light-emitting element can be efficiently collected by human vision system which is distanced from the OLED panel.

Based on the above basic concept of the present disclosure, various embodiments of the present disclosure will be described clearly and completely in conjunction with drawings of the present disclosure. All other embodiments or simple replacement or varieties from the embodiments described hereinafter by those of ordinary in the art without creative work are within the scope of the present disclosure.

Figure 2:
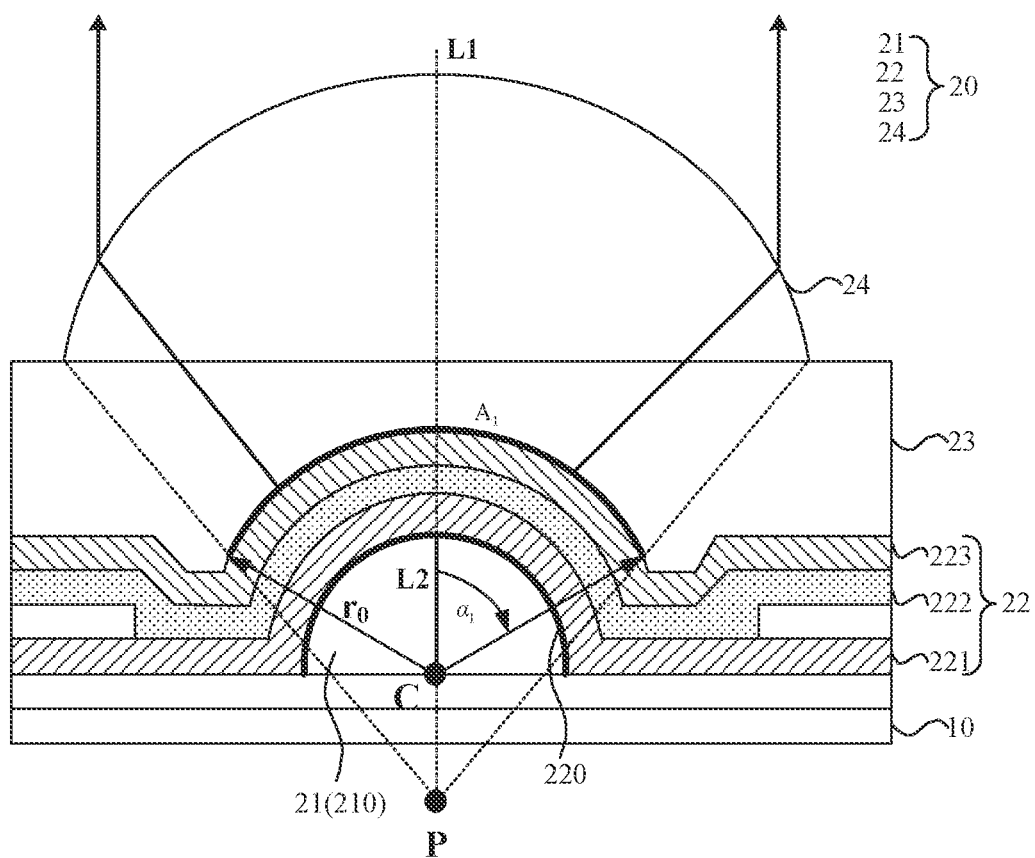
FIG. 2 shows a cross-sectional view of an OLED panel according to embodiments of the present disclosure.

FIG. 2 depicts a cross sectional view of an OLED panel according to embodiments of the present disclosure. As shown in FIG. 2, the OLED panel includes a substrate 10 and a light-emitting pixel array disposed on the substrate 10, and the light-emitting pixel array includes a plurality of light-emitting pixels 20. The light-emitting pixel 20 includes a convex structure layer 21, a light-emitting element 22, a planarization layer 23 and a microlens structure 24 which are sequentially stacked on the substrate 10. The convex structure layer 21 includes at least one convex structure 210 which is convex in a direction facing away from the substrate 10 and at least one convex surface 220 where the convex structure 210 is in contact with the light-emitting element 22. The microlens structure 24 and the convex structure 210 are aligned each other that their vertical projections on the substrate 10 overlap with the vertical projection of the light-emitting element 22 on the substrate 10.

In FIG. 2, P is the focal point of the microlens structure 24, and a confined area of the light-emitting element inside the cone volume formed by the bottom edge of the microlens structure 24 and the focal point P is A1. As shown in FIG. 2, the convex structure 210 is disposed between the light-emitting element 22 and the substrate 10, with its surface curvature being conformal to the curvature of the microlens. Assume the light-emitting element is Lambert surface, that the main light trace, which referring to the light emitted in normal angle from the surface of the light-emitting element, has the greatest intensity. Diffracted by the microlens structure 24, all main light traces from the light emitting element within the cone volume will be converted into a collimated light beam formed by substantially parallel light traces. With less diffusion in output light beam, the brightness of OLED panel are increased. In addition, since the effective light emitting area on a curved light-emitting element is larger than a light-emitting element on a flat surface, the overall light output from OLED is increased accordingly.

According to the OLED panel provided in the embodiments of the present disclosure, the light-emitting pixel includes the convex structure layer, the light-emitting element, the planarization layer and the microlens structure which are sequentially stacked on the substrate. The microlens structure and the convex structure are aligned each other that their vertical projections on the substrate overlap with the vertical projection of the light-emitting element on the substrate. Through coupling of the convex structure and the microlens structure, the parallel light component among the light emitted from the microlens structure can be increased, so that the display brightness of the OLED panel is increased.

In one embodiment, still referring to FIG. 2, the center of gravity axis L2 that passes through the center of gravity of the convex structure 210 coincides with the optical axis L1 of the microlens structure 24.

As shown in FIG. 2, L1 represents the optical axis of the microlens structure 24, L2 represents the gravity axis of the convex structure 210, C represents the center of gravity of the convex structure 210, P represents the focal point of the microlens structure 24, and the optical axis L1 of the microlens structure 24 passes through the point C of the convex structure 210 and coincides with the center of gravity axis L2 of the convex structure 210. As shown in FIG. 2, the thick solid line A1 represents the portion of light-emitting element inside a confined area of the cone volume formed by the bottom edge of the microlens structure 24 and the focal point P of the microlens structure 24. Diffracted by the microlens structure 24, the light photons emitted from this portion of the light-emitting element will converge into a substantially parallel beam after the microlens structure 24, so that the light-emitting element 22 inside in the cone volume is a plane light source positioned at the lens focal surface of the light-emitting element. The gravity axis L2 of the convex structure 210 is set to coincide with the optical axis L1 of the microlens structure 24, so that the area of a plane light source positioned at the lens focal surface of the light-emitting element inside the cone volume formed by the bottom edge of the microlens structure 24 and the focal point P of the microlens structure 24 may be ensured to be maximum, the light output from the light-emitting element 22 is increased, and the large-angle emitting light is reduced. By such an arrangement, the majority of light photons emitted from the light-emitting element can be efficiently collected by human eyes which is distanced from the OLED panel.

In one embodiment, still referring to FIG. 2, a ratio of the area of the light-emitting element 22 inside the cone volume formed by the bottom edge of the microlens structure 24 and the focal point P of the microlens structure 24 to the area of the light-emitting element 22 is greater than 50%.

The larger the area of the light-emitting element inside the cone volume formed by the bottom edge of the microlens structure 24 and the focal point P of the microlens structure, the larger the area of the plane light source positioned at the lens focal surface where parallel light can be provided, and the smaller the loss of large-angle light. Through a research, the applicant finds that when the ratio of the area of the light-emitting element 22 inside the cone volume to the area of the light-emitting element 22 is greater than 50%, that is, when the light-emitting element 22 has more than half of the area located in the cone volume formed by the bottom edge of the microlens structure 24 and the focal point P of the microlens structure, the parallelism of the light beams emitted from the light-emitting element 22 through the microlens structure 24 can be significantly improved, and the chromaticity of the OLED panel is improved.

In one embodiment, still referring to FIG. 2, the focal point P of the microlens structure 24 is disposed on the side of the convex surface 220 facing towards the substrate 10.

The above configuration ensures that a sufficient area of the light-emitting element is within the cone volume formed by the bottom edge of the microlens structure 24 and the focal point P of the microlens structure 24 to improve the parallelism of the light beams emitted from the light-emitting element 22 through the microlens structure 24. For example, the focal point P of the microlens structure is disposed inside the convex structure 210 or even on the side of the convex structure 210 facing away from the light-emitting element 22 to obtain a larger plane light source positioned at the lens focal surface. As can be seen from FIG. 2, a simple way to achieve this purpose is to reduce the thickness of the planarization layer 23 so that the focal point P of the microlens structure 24 moves downwards, bringing a larger area of the light-emitting element 22 into the cone volume.

In one embodiment, still referring to FIG. 2, the light-emitting element 22 includes a first electrode 221, a light-emitting functional layer 222, and a second electrode 223 sequentially stacked on the convex surface 220, and the first electrode 221 includes a reflective layer capable of reflecting light.

The OLED panel includes a top emission mode display panel and a bottom emission mode display panel. When the OLED panel is in the top emission mode, and the first electrode 221 is configured to include the reflective layer capable of reflecting light, a part of the light emitted from the light-emitting element 22 is reflected to the microlens structure 24 through the reflective layer on the surface of the first electrode 221, which improves the light utilization rate of the OLED panel.

Figure 3:
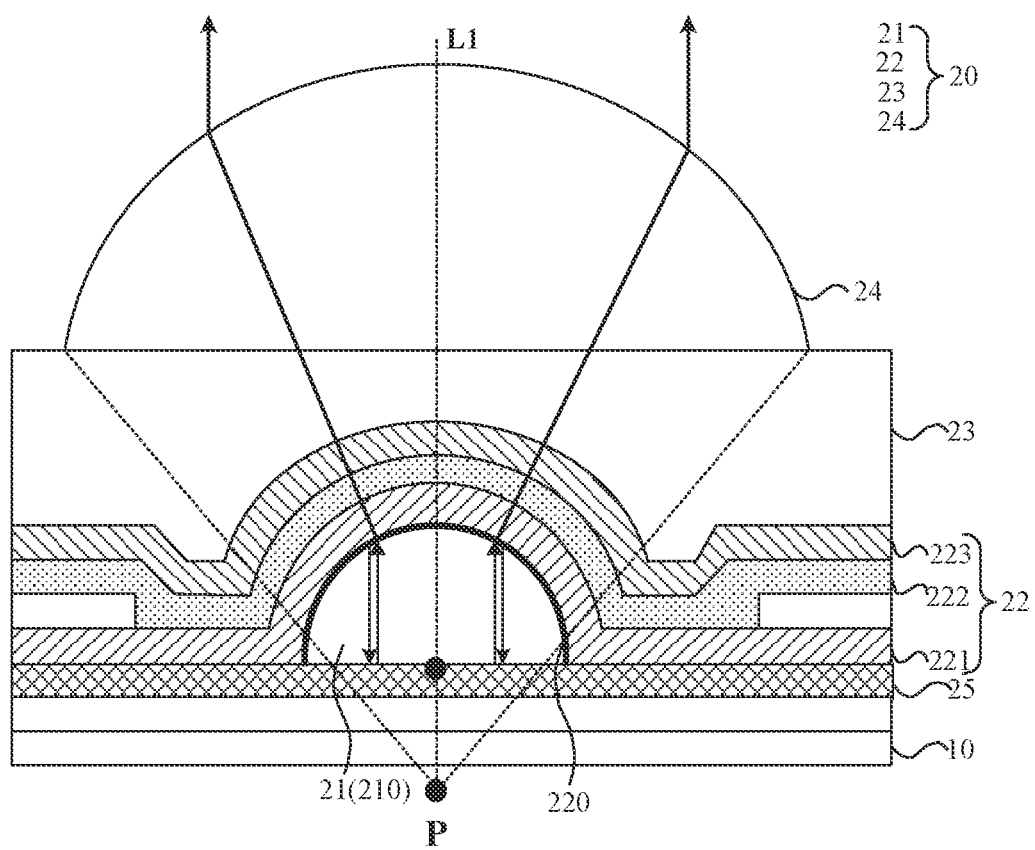
FIG. 3 shows a cross-sectional view of another OLED panel according to embodiments of the present disclosure.

Further, as shown in FIG. 3, the light-emitting element includes a first electrode 221, a light-emitting functional layer 222, and a second electrode 223 which are stacked sequentially on the convex surface, where the first electrode 221 is a transparent electrode; and the OLED panel further includes a reflective layer 25 disposed between the convex structure 210 and the substrate 10.

As shown in FIG. 3, the reflective layer 25 may be configured directly on one side of the convex structure 210 facing towards the substrate 10, the reflective layer 25 is disposed between the convex structure 210 and the substrate 10, and when light emitted from the light-emitting element 22 partially reaches the non-light-emitting side of the OLED panel, the light emitted from the light-emitting element 22 is reflected to the microlens structure 24 through the reflective layer 25 on the substrate 10, thereby improving the light utilization rate of the OLED panel.

Figure 4:
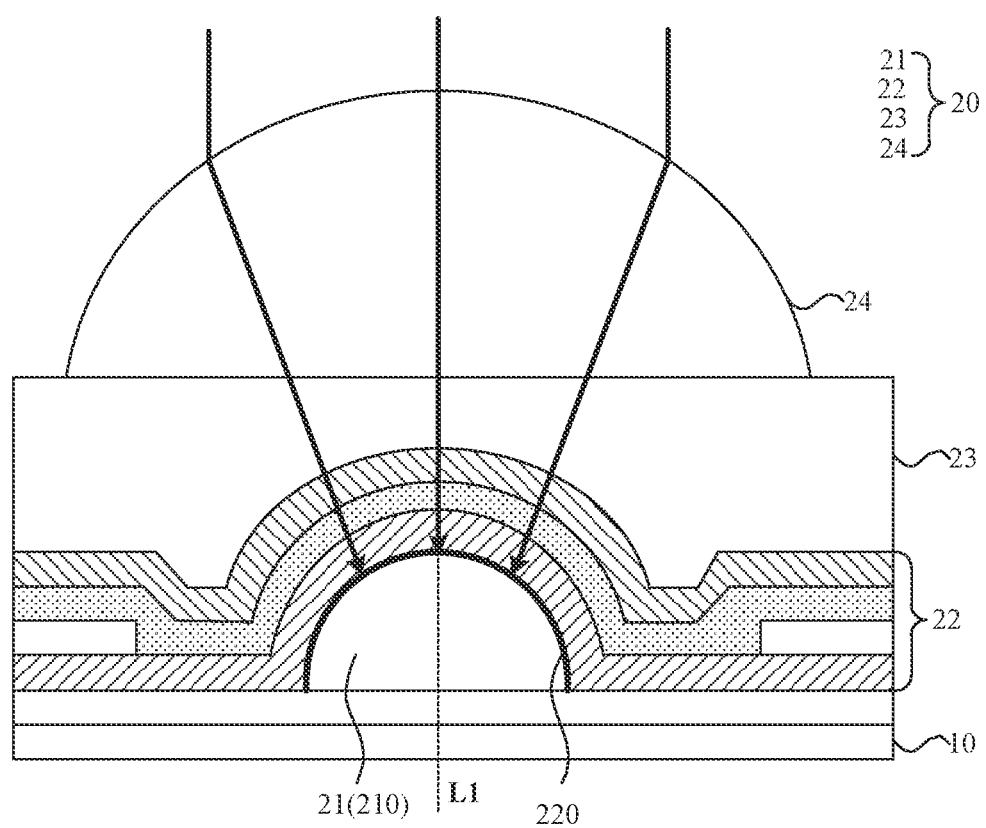
FIG. 4 shows a cross-sectional view of another OLED panel according to embodiments of the present disclosure.

In one embodiment, on the basis of the above embodiment, FIG. 4 shows a cross-sectional view of another OLED panel according to embodiments of the present disclosure. As shown in FIG. 4, the convex surface 220 satisfies that incident light parallel to the optical axis L1 of the microlens structure 24 is vertically incident on the convex surface 220 after the microlens structure 24. Consider a light trace is reversible in an optical system, the design of optical system of the OLED panel can be conducted by using incident light rather than emitted light. This is solely for the sake of simplicity hereinafter and are not supposed to vary the results.

As shown in FIG. 4, light beams in parallel with the optical axis L1 of the microlens structure 24 are incident on the surface of the microlens structure 24 and finally impinging on the surface of the light-emitting element 22 after being focused by the microlens structure 24. The surface curvature of the convex structure 210 can be made in a shape to allow the light beams incident on the surface of the convex structure in an essentially normal angle.

The main light refers to light beams emitted from the light-emitting element 22 of the OLED panel in the direction of a normal perpendicular to the tangent plane of the curved surface of the light-emitting element 22. According to the reversibility of the light trace, the main light emitted from the light-emitting element 22 disposed on the convex structure 210 will be a form of almost parallel light beams after passing through the microlens structure 24, thereby ensuring that the light emitted from the light-emitting element 22 can be emitted to a far position and maintain a relatively large photon density, i.e., a relatively small divergence angle, and thus improving the chromaticity of the OLED panel.

It is to be noted that FIG. 4 exemplarily illustrates a light path of ambient light incident on the microlens structure 24 and then perpendicularly incident on the surface of the light-emitting element 22. According to the principle of the reversibility of a light path, when the light-emitting element 22 of the OLED panel emits light, the light emitted in a tangential direction perpendicular to the surface of the light-emitting element 22 forms an approximately parallel light beam to the ambient environment through the microlens structure 24. The optical path thereof is opposite to the optical path of the ambient light incident on the microlens structure 24 and will not be described again.

Further, the shape of the convex structure 210 enables the main light emitted from the light-emitting element 22 covered thereon to form an approximately parallel light beam through the microlens structure 24. The shape of the curved surface of the microlens structure 24 and the shape of the curved surface of the convex structure 210 or the function relationship of the curved surfaces which satisfy the above-mentioned light beam propagation path are all within the scope of the present disclosure.

A functional relationship of the curved surfaces of the convex structure 210 and the microlens structure 24 are describes as follows.

In one embodiment, a surface of the lens of the microlens structure 24 is a rotationally symmetric curved surface around the optical axis of the microlens structure 24 and is represented by a function y=ƒ(x). The convex surface 220 is a rotationally symmetric curved surface around a center of gravity axis of the convex structure 210 and is represented by a function z=Q(x). Where the Z axis represents the center of gravity axis of the convex structure 210 or the optical axis of the microlens structure 24, x represents a vertical distance from any point on the surface of the lens or the convex surface to the Z axis. The functions f(x) and Q(x) satisfy:

$$Q(x) = GMT + \int_0^x \left[ f'(x) + \frac{s(x)}{\sqrt{1-s^2(x)}} \right] dx, \quad (1)$$

and $$s(x) = \frac{n1}{n2} \cdot \frac{f'(x)}{\sqrt{1+(f'(x))^2}}. \quad (2)$$

Where ƒ'(x) represents a first-order differential of ƒ(x), GMT is the maximum thickness of the convex structure, n2 denotes the refractive index of the microlens structure 24, and n1 denotes the refractive index of the medium space outside the microlens structure 24 and on the side facing away from the convex structure 210.

Figure 5:
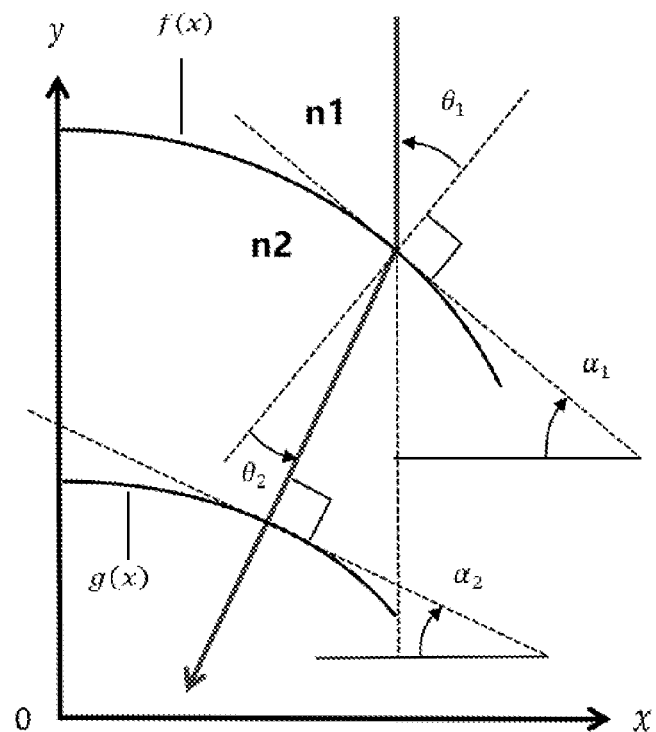
FIG. 5 plots a function relationship between a convex surface and a surface of the lens according to embodiments of the present disclosure.

As shown in FIG. 5, it is assumed that: the surface of the lens of the microlens structure 24 is the rotationally symmetric curved surface around the optical axis of the microlens structure 24 and is represented by the function z=ƒ(x), the convex surface 220 is the rotationally symmetric curved surface around the center of gravity axis of the convex structure 210 and is represented by the function z=Q(x). When a light beam parallel to the optical axis L1 of the microlens structure 24 is incident on the curved surface of the microlens structure 24, the refractive index of the medium space outside the microlens structure and on the side facing away from the convex structure is n1, and the refractive index of the microlens structure 24 is n2. The angle of incidence θ1 and the angle of refraction θ2 of the light beam satisfy:

$$\theta 1 = \alpha 1 = \arctan[-f'(x)], \quad (1)$$

and $$\theta 2 = \arcsin\left[\frac{n1}{n2}\sin(\theta 1)\right]. \quad (2)$$

When the light beam is incident on the curved surface of the microlens structure 24 and is refracted and then incident on the convex surface 220, the angle of incidence θ1 and the angle of refraction θ2 of the light beam satisfy:

$$\theta 1 - \theta 2 = \alpha 2 = \arctan[-Q'(x)]. \quad (3)$$

It can be deduced from the above three equations that:

$$Q(x) = Q(0) + \int_0^x \left[f'(x) + \frac{s(x)}{\sqrt{1-s^2(x)}}\right]dx. \quad (4)$$

Where s(x) may satisfy $$s(x) = \frac{n1}{n2} \cdot \frac{f'(x)}{\sqrt{1+(f'(x))^2}}.$$

ƒ'(x) is the first-order differential of ƒ(x)

As can be seen from Equation (4), the expression of the convex surface 220 of the convex structure 210 can be obtained by substituting the initial values of z=ƒ(x) and z=Q(x).

Figure 6:
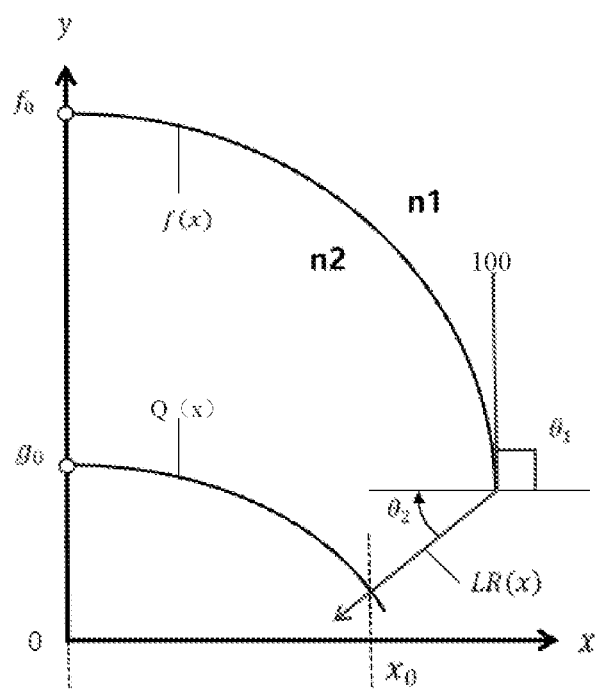
FIG. 6 plots a relative relationship in height between surfaces of a convex surface and a surface of the lens according to embodiments of the present disclosure.

The initial value Q(0) of the convex surface 220 can be solved and determined in a following method. As shown in FIG. 6, a special light trace, represented by a function LR (r), which is the most periphery light trace diffracted by the microlens, strikes normally on the surface of the convex structure 210. According to Equation (4) and a triangular relationship illustrated in FIG. 6, it can be derived that:

$$Q'(x) = \frac{-1}{\tan(\theta_2)} = f'(x) + \frac{s(x)}{\sqrt{1-s^2(x)}}. \quad (5)$$

By solving Equation (5), the coordinate of the intersection point of curve Q(x) and the light trace LR(x), denoted by $x_0$, can be obtained. Through solving the formular Q($x_0$)=LR($x_0$), (6) and LR($x_0$)=$h_0$−tan($\theta_2$)·($R_0$−$x_0$) (7), the coordinate of the summit of the convex structure 210 is obtained. In Equation (7), $R_0$ denotes the radius of the microlens structure, and $h_0$ denotes a height from the focal point of the microlens to the surface of the microlens.

In the above embodiment, the curved surface of the microlens structure 24 and the convex surface 220 of the convex structure 210 are both ideal rotationally symmetric surfaces. However, in actual production, due to manufacturing process variations, the curvatures of the microlens structure 24 and the convex structure 210 may vary within a certain range, for instance varying within positive and negative 15%, nevertheless they are still within the scope of the present disclosure.

In another embodiment, the convex structure 210 is made of a transparent material, and the refractive index of the convex structure 210 is greater than or equal to the refractive index of the light-emitting element 22.

Since a first part of the light beams emitted from the light-emitting element 22 of the OLED panel output toward the direction of the microlens structure 24, and a second part of the light beams output toward the direction of the convex structure 210, when the second part of the light beam reaches the reflective layer 25 through the convex structure 210 made of the transparent material, the second part of the light beam is reflected by the reflective layer 25. The refractive index of the convex structure 210 is set to be greater than or equal to the refractive index of the light-emitting element 22, so that the light beams incident on the convex structure 210 can be automatically converged into light beams with a relatively small angle, and the light beams passing through the convex structure 210 after being reflected by the reflective layer 25 are prevented from being emitted at a relatively large divergence angle, thereby ensuring that the reflected light is focused near the optical axis L1 of the microlens structure 24.

It is to be noted that the convex structure 210 is made of a transparent material, and may be considered transparent to visible light or to the spectral band of the light-emitting pixel where the convex structure 210 is located.

In another embodiment, the convex structure 210 contains pigment particles, and the color of the pigment particle may be the same as the light-emitting color of the light-emitting pixel where the convex structure 210 is located, thereby improving the chromaticity of the OLED panel.

Further, the pigment particle may be doped in the microlens structure 24 as well to add a function of color filtering to the microlens. By such an arrangement, the color filter film and associated manufacture processes can be deleted, resulting in a significant cost saving.

Figure 7:
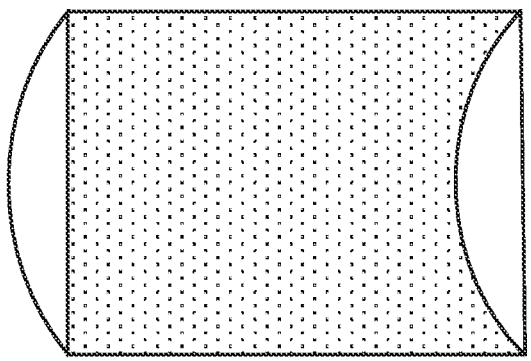
FIG. 7 shows a cross-sectional view of a convex structure and microlens structure according to embodiments of the present disclosure.
Figure 8:
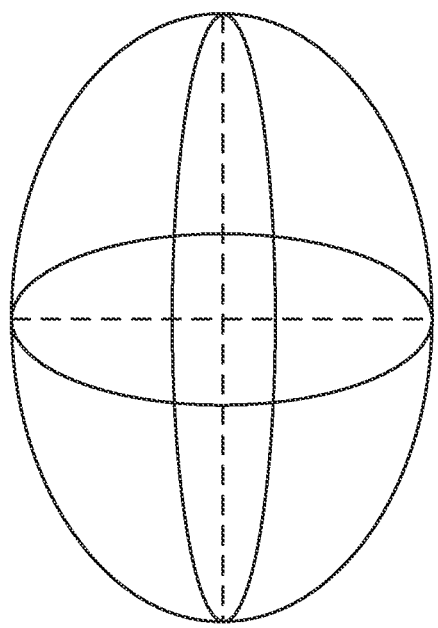
FIG. 8 shows a perspective view of an ellipsoid surface.

In the embodiments of the present disclosure, the convex surface and/or the surface of the lens may be in different curved surface shapes according to actual design requirements. For example, as shown in FIG. 2, the convex surface and/or the surface of the lens may include a portion of a spherical surface. In another example, as shown in FIG. 7, the convex surface and/or the surface of the lens may include a portion of cylindrical surface. As further shown in FIG. 8, the convex surface and/or the surface of the lens may include a part of an ellipsoid surface.

As shown in FIG. 2, when the focal point P of the microlens structure 24 is disposed on the side, facing towards the convex structure 210, of the convex surface where the convex structure 210 and the light-emitting element 22 are in contact, for example, the focal point of the microlens structure 24 is point P, the area of the a plane light source positioned at the lens focal surface of the light-emitting element satisfies $A_1 = 2\pi r_0^2 (1-\cos \alpha_1)$.

FIG. 2 exemplarily illustrates that the area of the light-emitting element inside the cone volume formed by the bottom edge of the microlens structure 24 and the focal point P of the microlens structure is calculated as A1 by taking the convex surface and the surface of the lens as parts of a spherical surface. When the convex surface and/or the surface of the lens include a portion of cylindrical surface or a portion of an ellipsoid surface, the area of the light-emitting element inside the cone volume may be calculated as A1 by taking the convex surface and the surface of the lens as parts of a spherical surface according to a surface calculation formula of the cylinder or a surface calculation formula of an ellipsoid.

Further, the convex surface and/or the surface of the lens include a portion of cylindrical surface, a part of a spherical surface, or a part of an ellipsoid surface, which may be regarded as a portion of standard cylindrical surface, a standard spherical surface, or a standard ellipsoid surface in a broad sense, and may also refer to a portion of approximate cylindrical surface, an approximate spherical surface, or an approximate ellipsoid surface.

Optionally, the convex surface includes a portion of an ellipsoid surface, the long axis of the ellipsoid surface coincides with the optical axis of the microlens structure 24, and a short axis of the ellipsoid surface is less than the diameter of the microlens structure 24.

Figure 9:
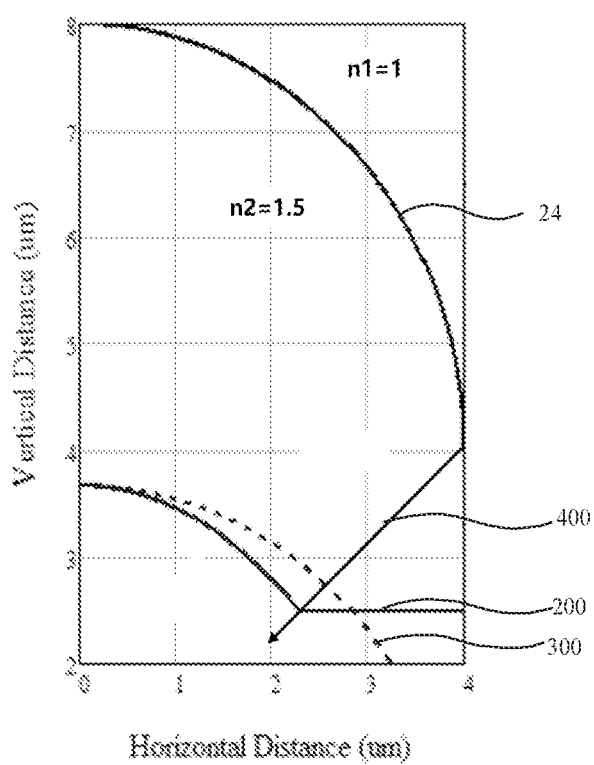
FIG. 9 plots a simulation example of a convex surface according to embodiments of the present disclosure.

FIG. 9 plots a simulation example according to embodiments of the present disclosure. Referring to FIG. 9, the surface of the microlens structure 24 is configured to be a hemispherical surface, n1 is the refractive index outside of the microlens structure 24 and n1=1, and n2 is the refractive index of the microlens structure 24 and n2=1.5. A convex surface illustrated by the curve 200 in FIG. 9 is obtained according to Equations (1) to (7). According to the assumption based on which the equations (1) to (7) are configured, an incident light beam in parallel with the optical axis of the microlens structure 24 will impinging vertically on the surface of the convex structure 210. For the purpose of comparison, a hemispherical surface curve 300 is illustrated at the same position of the curve 200, which suggests an ideal shape of the surface of the convex structure 210 is not exactly a semispherical, but rather an ellipsoid surface of a standing football. The long axis of the ellipsoid surface coincides with the optical axis of the microlens structure, the short axis of the ellipsoid curved surface is therefore perpendicular to the optical axis of the microlens structure. In addition, as indicated in FIG. 9, the short axis is less than or equal to the diameter of the microlens structure. As illustrated in FIG. 9, a light beam 400 defines a boundary of the light beam focused by the microlens structure. An intercept of the light beam 400 and the surface of the convex structure defines a starting point of a flat region. Since this flat region will not make an important contribution to the output parallel light beam, the light-emitting element should be disposed on the surface of the convex structure as much as possible, while other components, such as a pixel definition layer and other circuit components, should be disposed in this region. Due to variations in the actual manufacturing process, the curvatures of the microlens structure and the light-emitting element may not be exact as the curvature given by the simulation results. Nevertheless, the above simulation results provide a useful guidelines for device design and process parameter adjustment, and any dimension variations and misalignment of component assembly to some extent from the ideal mathematic model disclosed herein are still within the scope of disclosures.

The above detailed descriptions of the embodiments of the present invention set forth preferred modes contemplated by the inventor for carrying out the present invention at the time of filing this application, and are provided by way of examples and not as limitations. Accordingly, various modifications and variations obvious to a person of ordinary skill in the art to which it pertains are deemed to lie within the scope and spirit of the present invention as set forth in the following claims.

What is claimed is:

1. An organic light-emitting diode display (OLED) panel, comprising:
    a substrate; and
    a light-emitting pixel array disposed on the substrate and comprising a plurality of light-emitting pixels;
    wherein each of the plurality of light-emitting pixels comprises a convex structure layer, a light-emitting element, a planarization layer and a microlens structure which are sequentially stacked on the substrate;
    wherein the convex structure layer comprises at least one convex structure which is convex in a direction facing away from the substrate and at least one convex surface where the at least one convex structure is in contact with the light-emitting element;
    wherein the microlens structure and the at least one convex structure are aligned with each other such that their vertical projections on the substrate overlap with a vertical projection of the light-emitting element on the substrate; and
    wherein each of the at least one convex surface satisfies that: light emitted from the light-emitting element and perpendicular to the convex surface is converted into parallel light that is parallel to an optical axis of the microlens structure after interaction with the microlens structure.

2. The OLED panel according to claim 1, wherein a center of gravity axis passing through a center of each of the at least one convex structure coincides with the optical axis of the microlens structure.

3. The OLED panel according to claim 1, wherein a ratio of an area of the light-emitting element inside a cone volume formed by a bottom edge of the microlens structure and a focal point of the microlens structure to an area of the light-emitting element is greater than 50%.

4. The OLED panel according to claim 1, wherein a focal point of the microlens structure is disposed on one side of the at least one convex surface facing towards the substrate.

5. The OLED panel according to claim 1, wherein the light-emitting element comprises a first electrode, a light-emitting functional layer, and a second electrode which are stacked sequentially on the at least one convex surface, wherein the first electrode comprises a reflective layer capable of reflecting light.

6. The OLED panel according to claim 1, wherein a surface of a lens of the microlens structure is a rotationally symmetric curved surface around the optical axis of the microlens structure and is represented by a function $z=f(x)$, and each of the at least one convex surface is a rotationally symmetric curved surface around a center of gravity axis of one of the at least one convex structure and is represented by a function $z=Q\ x)$;
    wherein a Z axis represents the center of the gravity axis of each of the at least one convex structure or the optical axis of the microlens structure, x denotes a vertical distance from any point on the surface of the lens or the each of the at least one convex surface to the Z axis, and the functions $f(x)$ and $Q(x)$ satisfy:

$$Q(x) = GMT + \int_0^x \left[ f'(x) + \frac{s(x)}{\sqrt{1-s^2(x)}} \right] dx;$$

and $$s(x) = \frac{n1}{n2} \cdot \frac{f'(x)}{\sqrt{1+(f'(x))^2}};$$

wherein $f'(x)$ represents a first-order differential of $f(x)$, GMT is a maximum thickness of the each of the at least one convex structure, n2 denotes a refractive index of the microlens structure, and n1 denotes a refractive index of a medium space outside the microlens structure and on one side facing away from the each of the at least one convex structure.

7. The OLED panel according to claim 6, wherein the convex surface and/or the surface of the lens comprise a portion of cylindrical surface.

8. The OLED panel according to claim 6, wherein the convex surface and/or the surface of the lens comprise a portion of a spherical surface or a portion of an ellipsoid surface.

9. The OLED panel according to claim 8, wherein the convex surface comprises a portion of the ellipsoid surface, a long axis of the ellipsoid surface coincides with the optical axis of the microlens structure, and a short axis of the ellipsoid surface is less than a diameter of the microlens structure.

10. The OLED panel according to claim 1, wherein the light-emitting element comprises a first electrode, a light-emitting functional layer, and a second electrode which are stacked sequentially on each of the at least one convex surface, wherein the first electrode is a transparent electrode, and the OLED panel further comprises a reflective layer disposed between each of the at least one convex structure and the substrate.

11. The OLED panel according to claim 10, wherein each of the at least one convex structure is made of a transparent material, and a refractive index of the each of the at least one convex structure is greater than or equal to a refractive index of the light-emitting element.

12. The OLED panel according to claim 10, wherein each of the at least one convex structure is doped with a pigment particle, and a color of the pigment particle is same as a light-emitting color of a light-emitting pixel where the each of the at least one convex structure is located.

13. The OLED panel according to claim 1, wherein the microlens structure is doped with a pigment particle, and a color of the pigment particle is same as a light-emitting color of a light-emitting pixel where the microlens structure is located.

* * * * *